United States Patent
Smith et al.

(10) Patent No.: US 7,205,672 B1
(45) Date of Patent: Apr. 17, 2007

(54) FLIP CHIP MOUNTED TO THERMAL SENSING ELEMENT THROUGH THE BACK SIDE OF THE CHIP

(75) Inventors: Gregory J. Smith, Tucson, AZ (US); John W. Oglesbee, Watkinsville, GA (US)

(73) Assignees: National Semiconductor Corporation, Santa Clara, CA (US); Motorola, Inc., Schaumburg, IL (US)

(*) Notice: Subject to any disclaimer, the term of this patent is extended or adjusted under 35 U.S.C. 154(b) by 0 days.

(21) Appl. No.: 10/740,239

(22) Filed: Dec. 17, 2003

Related U.S. Application Data

(63) Continuation of application No. 10/011,158, filed on Dec. 5, 2001, now abandoned.

(51) Int. Cl.
*H01L 23/48* (2006.01)
(52) U.S. Cl. ............................ 257/778; 257/720
(58) Field of Classification Search ............... 257/665, 257/536, 782, 783, 778, 779, 718, 719, 720
See application file for complete search history.

(56) References Cited

U.S. PATENT DOCUMENTS

| | | | | |
|---|---|---|---|---|
| 4,459,632 A * | 7/1984 | Nijman et al. | ............... | 361/56 |
| 4,649,333 A | 3/1987 | Moore | .................. | 320/31 |
| 4,780,598 A | 10/1988 | Fahey et al. | .................. | 219/511 |
| 5,488,254 A | 1/1996 | Nishimura et al. | .......... | 257/707 |
| 5,533,256 A | 7/1996 | Call et al. | ..................... | 29/840 |
| 5,587,882 A * | 12/1996 | Patel | ............................ | 361/705 |
| 5,644,461 A * | 7/1997 | Miller et al. | .................. | 361/56 |
| 5,796,160 A | 8/1998 | Kozono | ........................ | 257/675 |
| 5,811,876 A | 9/1998 | Haga et al. | .................. | 257/675 |
| 6,002,239 A | 12/1999 | Maloizel | ..................... | 320/136 |
| 6,255,141 B1 | 7/2001 | Singh et al. | ................. | 438/123 |
| 6,331,764 B1 | 12/2001 | Oglesbee et al. | ........... | 320/136 |
| 6,489,879 B1 * | 12/2002 | Singh et al. | ................. | 337/167 |
| 6,519,154 B1 * | 2/2003 | Chiu | ............................ | 361/704 |
| 6,770,513 B1 * | 8/2004 | Vikram et al. | ............... | 438/122 |
| 2001/0015477 A1 | 8/2001 | Singh et al. | ................. | 257/665 |
| 2002/0130398 A1 | 9/2002 | Huang | .......................... | 257/666 |
| 2002/0145194 A1 * | 10/2002 | O'Connor et al. | .......... | 257/712 |

OTHER PUBLICATIONS

U.S. Appl. No. 10/010,029, filed Dec. 5, 2001.

* cited by examiner

*Primary Examiner*—Tuan H. Nguyen
(74) *Attorney, Agent, or Firm*—Beyer Weaver LLP

(57) ABSTRACT

A method for providing cooled flip chip is provided. Solder paste is placed on a back side of a flip chip. A heat sink is placed against the solder paste. The solder paste is reflowed. In addition, an apparatus is provided. Generally, a zener diode flip chip with an active side and a back side opposite the active side and a positive thermal coefficient resistor are provided. A thermally conductive connection is between the positive thermal coefficient resistor and the back side of the zener diode flip chip.

13 Claims, 6 Drawing Sheets

FLIP CHIP MOUNTED TO THERMAL SENSING ELEMENT THROUGH THE BACK SIDE OF THE CHIP

RELATED APPLICATIONS

This application is a continuation of application Ser. No. 10/011,158 entitled "FLIP CHIP MOUNTED TO THERMAL SENSING ELEMENT THROUGH THE BACK SIDE OF THE CHIP," by Gregory Smith and John W. Oglesbee (now abandoned), filed on Dec. 5, 2001, from Which priority under 35 U.S.C. §120 is claimed, and incorporated herein by reference.

This application is also related to the commonly assigned application Ser. No. 10/010,029 entitled "INTEGRATED CIRCUIT PACKAGE WITH THERMAL SENSING ELEMENT", by Gregory Smith and John W. Oglesbee (now abandoned), filed on Dec. 5, 2001 and incorporated herein by reference.

FIELD OF THE INVENTION

The present invention relates generally to integrated circuits. More specifically, the invention relates to thermal connections for integrated circuits to provide improved heat sensing and voltage control.

BACKGROUND OF THE INVENTION

For various reasons it may be desirable to conduct heat away from a flip chip. In the prior art, solder bumps, which are used for electrical connections, were also used to conduct heat from a flip chip. Such solder bumps, may not provide sufficient heat conduction.

It is desirable to provide an improved method and apparatus for conducting heat away from a flip chip.

SUMMARY OF THE INVENTION

To achieve the foregoing and other objects and in accordance with the purpose of the present invention, an apparatus is provided. Generally, a zener diode flip chip with an active side and a back side opposite the active side and a positive thermal coefficient resistor are provided. A thermally conductive connection is between the positive thermal coefficient resistor and the back side of the zener diode flip chip.

A method for providing cooled flip chip is also provided. Solder paste is placed on a back side of a flip chip. A heat sink is placed against the solder paste. The solder paste is reflowed.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
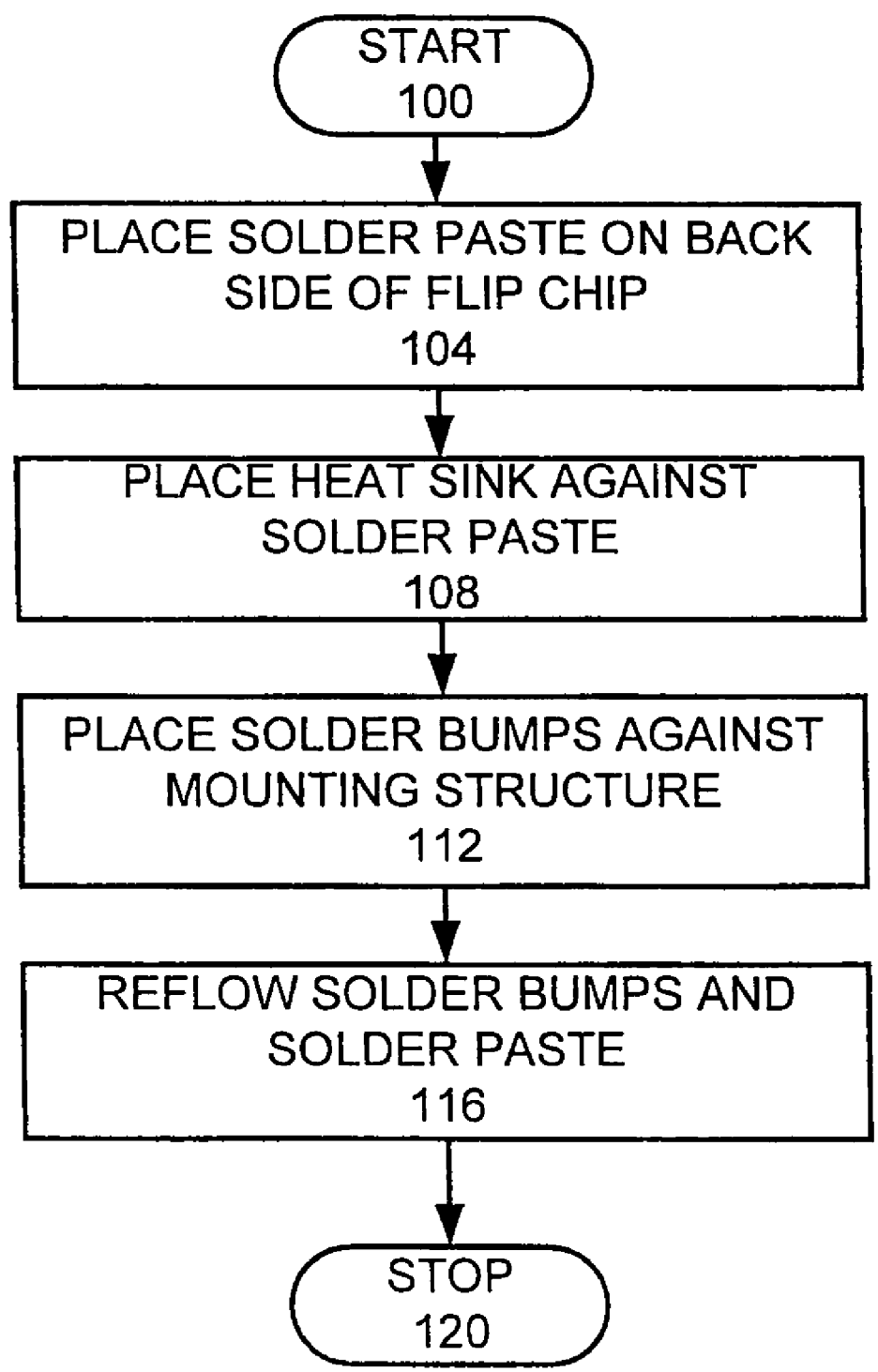
FIG. 1 is a flow chart of a method used in a preferred embodiment of the invention.
Figure 2:
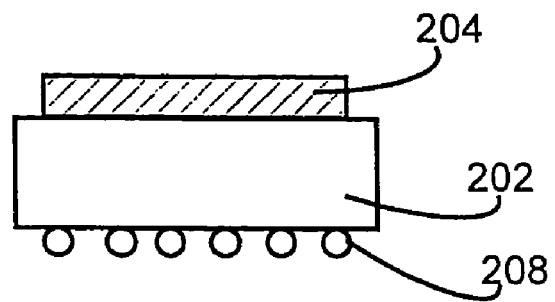
FIG. 2 is a side view of a flip chip with solder paste on the back side of the flip chip.
Figure 3:
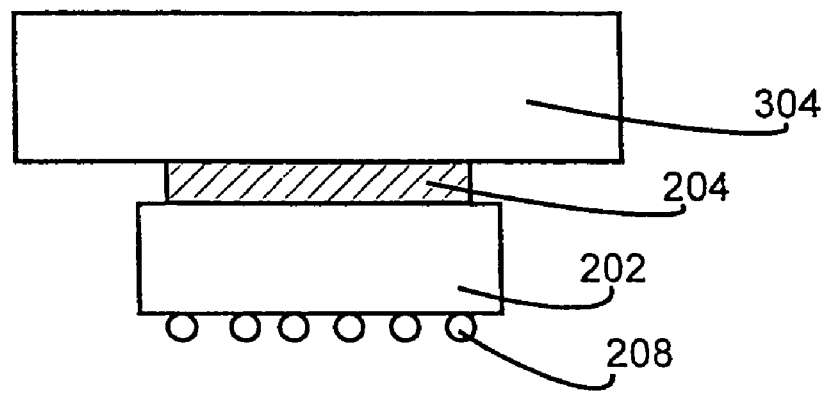
FIG. 3 is a side view of the flip chip, where a heat sink is placed against the solder paste.
Figure 4:
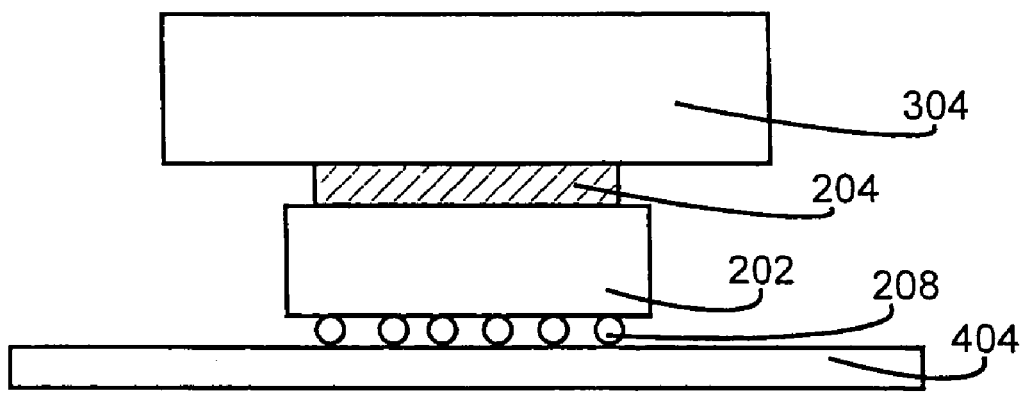
FIG. 4 is a side view of the flip chip, where the solder bumps are placed against a mounting structure.

To facilitate discussion, FIG. 1 is a flow chart of a method used in a preferred embodiment of the invention. According to the flow chart of FIG. 1, a solder paste is provided to a back side of a flip chip (step 104). FIG. 2 is a side view of a flip chip 202 with solder paste 204 on the back side of the flip chip. The back side of the flip chip 202 is defined as the side of the flip chip 202 that is opposite from the active side of the flip chip attached to the solder bumps 208. In the specification and claims solder bumps also include solder balls or other electrical connections used to electrically connect a flip chip. A heat sink is then placed against the solder paste 204 (step 108). FIG. 3 is a side view of the flip chip 202, where a heat sink 304 is placed against the solder paste 204. The solder bumps 208 are then placed against a mounting structure (step 112). FIG. 4 is a side view of the flip chip, where the solder bumps are placed against a mounting structure 404, such as a printed circuit board or a lead frame. The solder bumps 208 and solder paste 204 are reflowed to attach the heat sink 304 and the mounting structure 404 to the flip chip (step 116). Such a reflow may be performed by placing the structure in an oven or by placing a current across the solder bumps and solder paste.

In other embodiments, two or more solder reflows may be used. For example between the step of placing the heat sink against the solder paste (step 108) and the step of placing the solder bumps against the mounting structure (step 112) the solder paste may be reflowed to connect the heat sink to the flip chip, so that the heat sink and flip chip may be marketed or provided as a single unit.

The large area of the solder paste connected to the back side of the flip chip and the heat sink allows for a larger amount of heat transfer from the flip chip compared to smaller area connections between the solder bumps and the mounting structure. The heat sink may have various forms. Heat sinks with fins are known to provide improved cooling.

The improved heat transfer provides a preferred embodiment of the invention where the flip chip may be a zener diode and the heat sink may form part of a Positive Temperature Coefficient (PTC) resistor, which is a resistor that increases resistance as temperature increases, and where generally at a certain temperature the resistance greatly increases.

Figure 5:
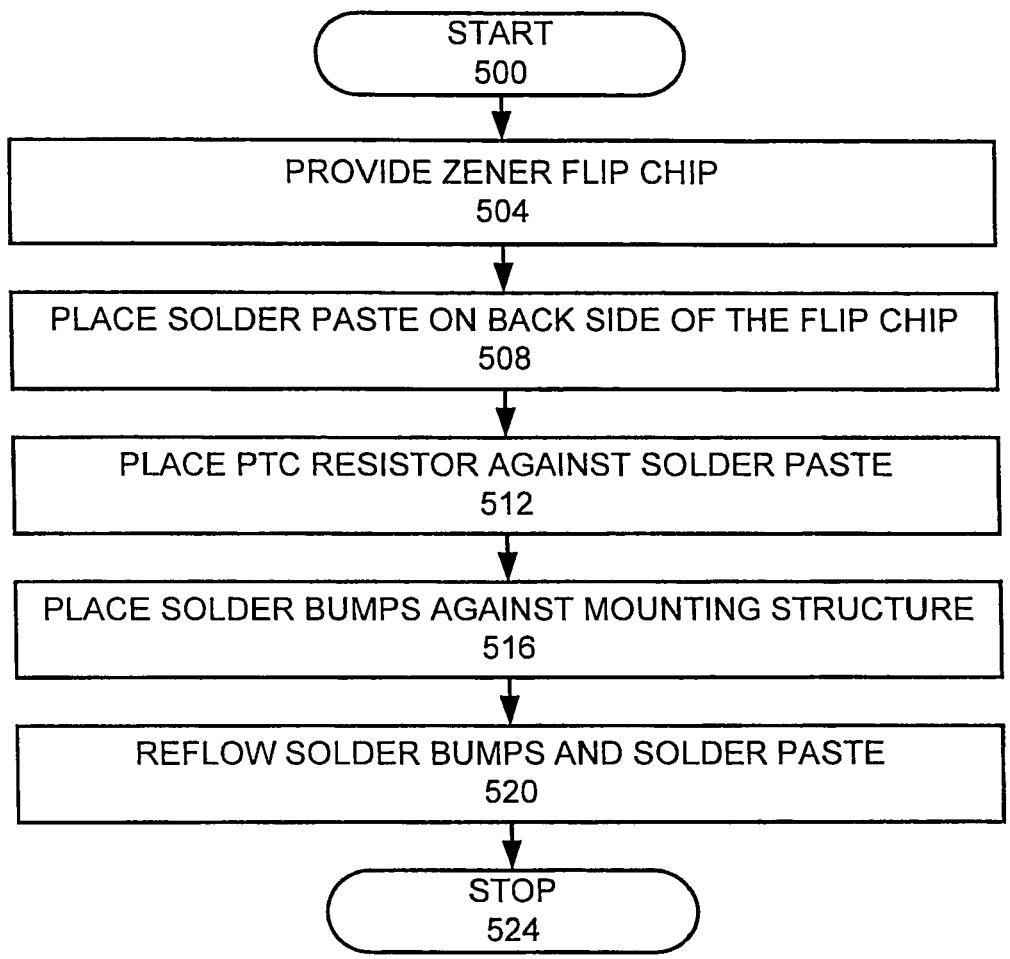
FIG. 5 is a flow chart of a method used in a preferred embodiment of providing a zener diode flip chip connected to a PTC resistor.
Figure 6:
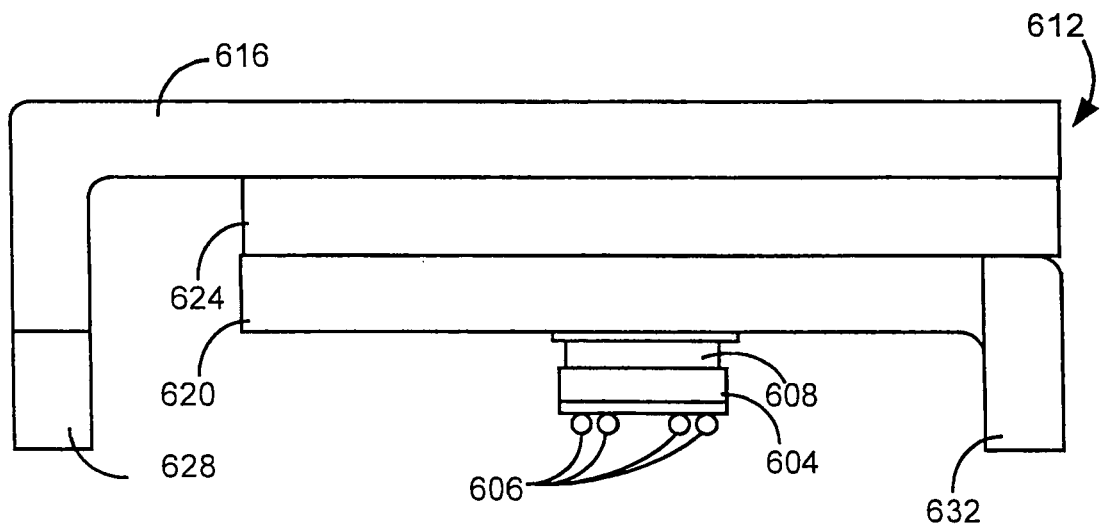
FIG. 6 is a side view of a zener flip chip with a plurality of solder bumps on a front side of the zener flip chip.
Figure 7:
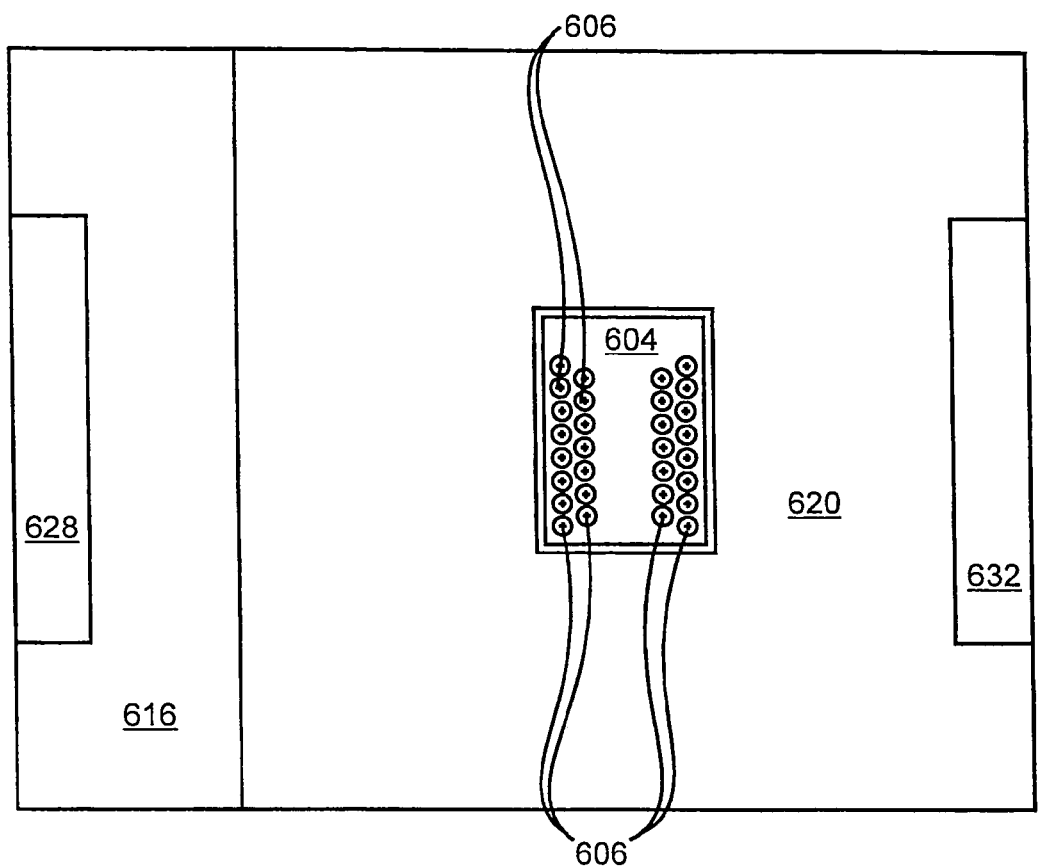
FIG. 7 is a bottom view of the PTC resistor and the zener flip chip.

FIG. 5 is a flow chart of a method used in a preferred embodiment of providing a zener diode flip chip connected to a PTC resistor. A zener flip chip is provided (step 504). FIG. 6 is a side view of a zener flip chip 604 with a plurality of solder bumps 606 on a front side of the zener flip chip 604. A solder paste 608 is placed on the back side of the flip chip (step 508). A PTC resistor 612 is placed against the solder paste (step 512). The PTC resistor 612 comprises a first lead 616, a second lead 620, and a middle layer 624 sandwiched between the first lead 616 and the second lead 620. In the preferred embodiment the first lead 616 and the second lead 620 may be made of nickel, and the middle layer 624 may be a polymer. A first terminal 628 may be used to provide an electrical connection to the first lead 616. A second terminal 632 may be used to provide an electrical connection to the second lead 620. In the preferred embodiment, the first terminal 628 and the second terminal 632 may be tin plated brass. FIG. 7 is a bottom view of the PTC resistor 612 and the zener flip chip 604. In this preferred embodiment of the invention the solder bumps 606 are grouped together in two groupings.

Figure 8:
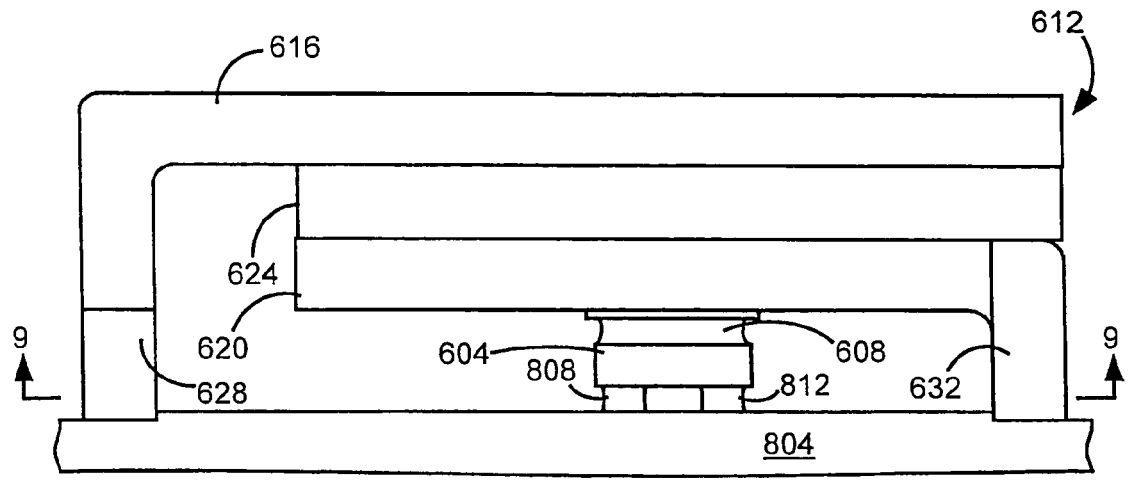
FIG. 8 is a side view of the zener flip chip and the PTC resistor mounted on a mounting structure after the solder bumps and solder paste are reflowed.
Figure 9:
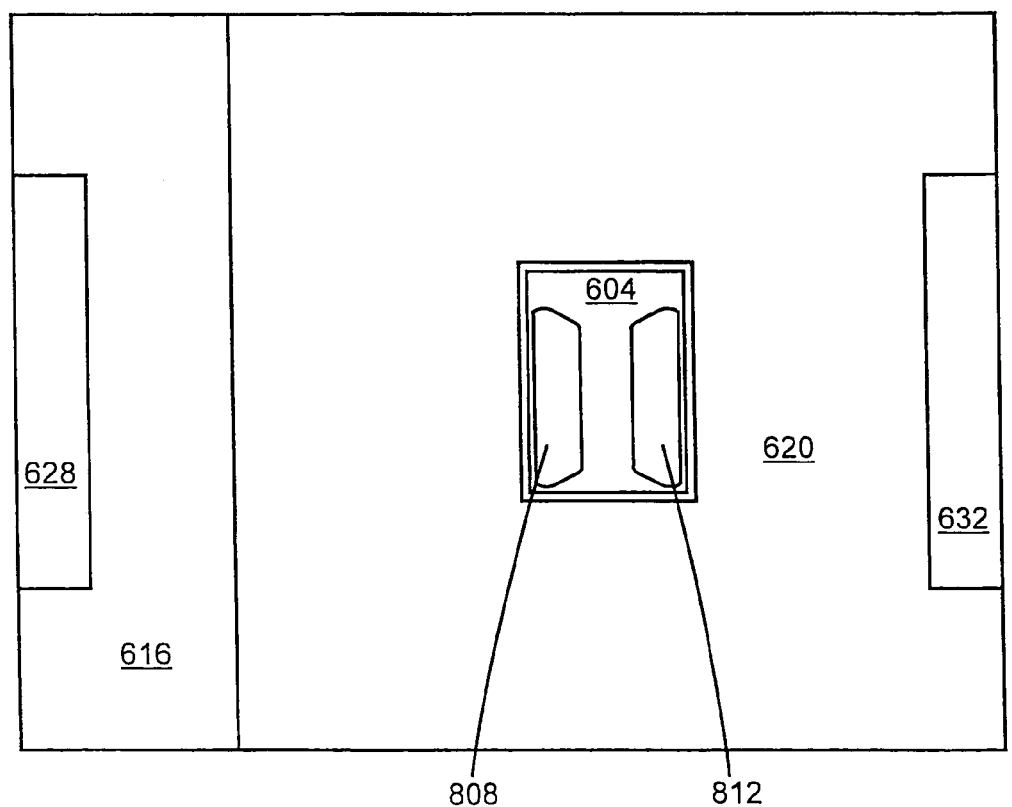
FIG. 9 is a cross-sectional view of the zener flip chip and PTC resistor along cut lines 9—9.

The solder bumps 606 are placed against a mounting structure, such as a printed circuit board or a lead frame (step 516). The solder bumps 606 and the solder paste 608 are reflowed (step 520). FIG. 8 is a side view of the zener flip chip 604 and the PTC resistor 612 mounted on a mounting structure 804 after the solder bumps and solder paste 608 are reflowed, of a preferred embodiment of the invention. FIG. 9 is a cross-sectional view of the zener flip chip 604 and PTC resistor 612 along cut lines 9—9. The solder bumps have been reflowed into a first flip chip terminal 808 and a second flip chip terminal 812. In this embodiment, fifteen solder bumps have been reflowed to form the first flip chip terminal 808, and fifteen solder bumps have been reflowed to form the second flip chip terminal 812. By forming each terminal from a plurality of solder bumps or solder bumps a terminal with a surface area larger than the individual solder bumps or solder bumps may be formed to allow the conduction of a larger current with lower resistance.

In another embodiment, a first reflow of the solder paste may be performed before placement on the mounting surface. Such a reflow allows the PTC resistor and the zener flip chip to be joined and marketed as a single unit.

Figure 10:
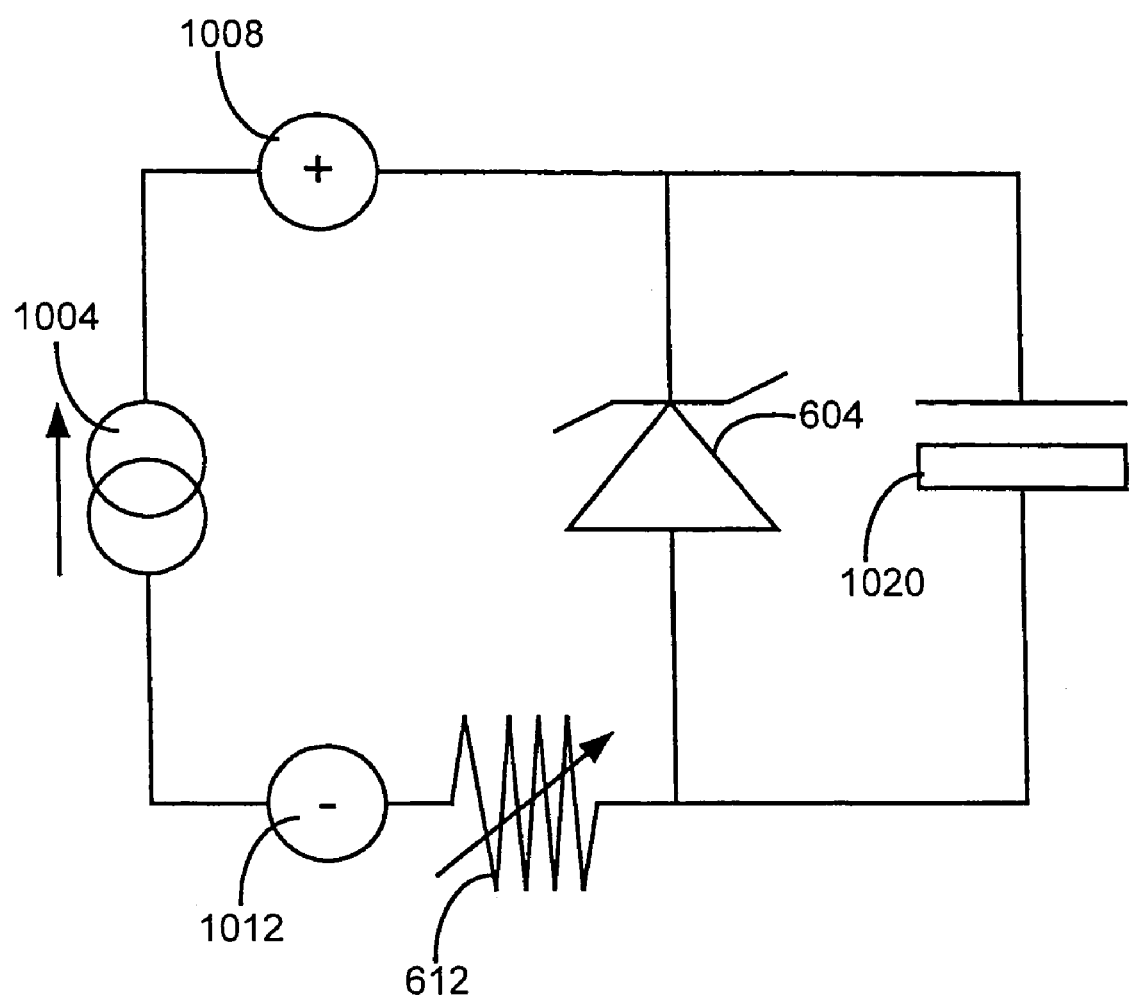
FIG. 10 is a schematic view of a circuit that uses the zener diode and PTC resistor combination described above.

In various electronic systems, such as in a battery recharger it is desirable to provide a circuit which causes a circuit to open if too high of a voltage is applied. FIG. 10 is a schematic view of a circuit that uses the zener diode and PTC resistor combination described above. A voltage source 1004 has a positive terminal 1008 and a negative terminal 1012. A first end of a PTC resistor 612 is connected to the negative terminal 1012. A battery or cell 1020 and a zener diode 604 are connected in parallel between the positive terminal 1008 and a second end of the PTC resistor 612. The zener diode 604 is thermally connected to the PTC resistor 612, through a thermal connection formed by the solder paste 624. The cell 1020 may be used to provide a set voltage V, for example 6 volts. The voltage source 1004 should provide a charging voltage C, which is slightly larger than V, for example 6.5 volts, to charge the cell 1020. The zener diode 604 is set to allow a current when a reverse bias voltage is applied, which is larger than the charging voltage C. The PTC resistor 612 is designed to have low resistance when a current, which results from the application of the charging voltage C across the cell 1020, is passed through the PTC resistor 612.

In operation, the voltage source 1004 applies a charging voltage across the terminal 1008, 1012. The charging voltage C causes the cell 1020 to charge and produces a current, which passes through the PTC resistor 612 at a low resistance. During normal operation the charging voltage C is less than the reverse bias of the zener diode 604, so that little or no current passes through the zener diode 604. If the voltage source 1004 malfunctions and provides a voltage greater than C and greater than the reverse bias of the zener diode 604, current will begin to flow through the zener diode 604, causing the zener diode 604 to heat up. Heat from the zener diode 604 is transferred through the solder 608 to the PTC resister 612. The heat from the zener diode 604 causes the resistance in the middle layer 624 of the PTC resistor 612 to increase to the point where the circuit is virtually an open circuit. PTC resistors are also known as resettable fuses or self-resetting fuses. When overheated resettable fuses create a high resistance creating a virtual open circuit. When cooled resettable fuses automatically close the circuit. Prior art circuits that do not use a zener diode use the self-heating of the PTC resistor to open the circuit. Such self-heating may be too slow, which could cause damage to the cell and/or circuitry before the circuit is opened. The zener diode 604 causes the PTC resistor 612 to heat up quicker so that damage to the cell and or circuit may be prevented. Since the layer of solder paste between the zener diode 604 and PTC resistor 612 may be relatively thin, heat is able to pass from the zener diode 604 to the PTC resistor 612 quickly, providing a quicker response time. In addition, the first and second flip chip terminals 808, 812, each formed by a plurality of solder bumps, provide a large conductive cross section to allow a large current to pass through the zener diode 604, which allows faster heating of the zener diode 604.

Such battery rechargers are used on portable electronic device, where compactness is desirable. The inventive flip-chip and PTC resistor combination provides the desired compactness. The terminals for the zener diode and PTC resister may be placed so that they may be mounted on the same mounting structure, which may provide an easier mounting.

In other embodiments of the invention other thermally conductive mechanically connective layers may be used in the place of the solder paste layer to provide a thermally conductive mechanical connection between the flip chip, such as the zener diode, and the heat sink, such as the PTC resistor. Such thermally conductive mechanically connective layers may be a thermally conductive epoxy. Thermally conductive is at least as half as thermally conductive as solder and more preferably is as thermally conductive as solder. Providing a preferred thermal connection with a layer of thermally conductive material, provides a large cross-sectional area that conducts the heat and a thickness, which is much less in size than the cross sectional area, so that the distance that the heat travels may be minimized. The conductive mechanical connection, such as solder or epoxy, provide a mechanical connection that is able to support the weight of the flip chip since the conductive mechanical connection is stronger than support provided to a flip chip by a thermal compound of thermal greases, which may be used for a conductive connection.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. An apparatus, comprising:
a zener diode flip chip with an active side and a back side opposite the active side;
a positive thermal coefficient resistor, comprising;
 a first lead with a first surface;
 a middle layer connected to the first surface of the first lead; and
 a second lead connected to the middle layer, so that the middle layer separates the first lead from the second lead, and wherein the second lead is connected to the thermally conductive connection;
electrical connections on the active side of the flip chip, wherein the electrical connections comprise a first terminal and a second terminal, wherein the first terminal is formed from a plurality of solder bumps adn the second terminal is formed by a plurality of solder bumps; and
a thermally conductive connection between the positive thermal coefficient resistor and the back side of the zener diode flip chip.

2. The apparatus, as recited in claim 1, wherein the thermally conductive connection is a layer of solder.

3. The apparatus, as recited in claim 2, further comprising a mounting structure electrically and mechanically connected to the active side of the flip chip.

4. The apparatus, as recited in claim 2, wherein the first terminal is formed from a first plurality of solder bumps that have been reflowed to form the first terminal and the second terminal is formed by a second plurality of solder bumps that have been reflowed to form the second terminal.

5. The apparatus, as recited in claim 1, wherein the thermally conductive connection is a thermally conductive mechanical connection.

6. The apparatus, as recited in claim 5, wherein the thermally conductive mechanical connection comprises a layer of thermally conductive adhesive.

7. The apparatus, as recited in claim 1, further comprising a mounting structure electrically and mechanically connected to solder bumps connected to the active side of the flip chip and the mounting structure.

8. The apparatus, as recited in claim 1, wherein a first lead of the positive coefficient resistor and a second lead of the positive thermal coefficient resistor and the active side of the flip chip are adapted to be mounted on a common mounting structure.

9. A cooled flip chip connected to a mounting structure, comprising:
a flip chip with an active side and a back side opposite the active side;
a heat sink;
a thermally conductive mechanical connection between the heat sink and the back side of the flip chip; and
a plurality of solder bumps electrically and mechanically connected to an active side of a flip chip and the mounting structure, wherein a first terminal is formed from a first plurality of the plurality of solder bumps and a second terminal is formed from a second plurality of the plurality of solder bumps, wherein the thermally conductive mechanical connection is provided by a layer of thermally conductive material and wherein the flip chip is a zener diode and the heat sink is a positive temperature coefficient resistor.

10. The cooled flip chip, as recited in claim 9, wherein the positive temperature coefficient resistor comprises:
a first lead with a first surface;
a middle layer connected to the first surface of the first lead; and
a second lead connected to the middle layer, so that the middle layer separates the first lead from the second lead, and wherein the second lead is connected to the thermally conductive mechanical connection.

11. The cooled flip chip, as recited in claim 10, wherein the layer of thermally conductive mechanical connection is a layer of solder.

12. The cooled flip chip, as recited in claim 9, wherein the first terminal is formed by reflowing the first plurality of the plurality of solder bumps and the second terminal is formed by reflowing the second plurality of the plurality of solder bump.

13. The cooled flip chip, as recited in claim 12, wherein the first terminal, the second terminal, the first lead, and the second lead are adapted to be mounted on a common mounting structure.

* * * * *

UNITED STATES PATENT AND TRADEMARK OFFICE
CERTIFICATE OF CORRECTION

PATENT NO. : 7,205,672 B1
APPLICATION NO. : 10/740239
DATED : April 17, 2007
INVENTOR(S) : Smith et al.

It is certified that error appears in the above-identified patent and that said Letters Patent is hereby corrected as shown below:

In Claim 1, Column 5, line 26, "adn" should be --and--.

Signed and Sealed this

Second Day of September, 2008

JON W. DUDAS
*Director of the United States Patent and Trademark Office*